United States Patent

Megeid

[11] Patent Number: 5,905,802
[45] Date of Patent: May 18, 1999

[54] DUAL ACTION AUTOMATIC SOUND LEVEL CONTROL

[75] Inventor: Magdy Megeid, Zurich, Switzerland

[73] Assignee: RCA Thomson Licensing Corporation, Princeton, N.J.

[21] Appl. No.: 08/894,779

[22] PCT Filed: Mar. 21, 1996

[86] PCT No.: PCT/IB96/00250

§ 371 Date: Aug. 22, 1997

§ 102(e) Date: Aug. 22, 1997

[87] PCT Pub. No.: WO96/29780

PCT Pub. Date: Sep. 26, 1996

[30] Foreign Application Priority Data

Mar. 23, 1995 [GB] United Kingdom .................. 9505946

[51] Int. Cl.[6] .................................................. H03G 3/00
[52] U.S. Cl. ......................... 381/108; 381/107; 330/284
[58] Field of Search .................................. 381/104, 107, 381/108; 330/284, 278

[56] References Cited

U.S. PATENT DOCUMENTS 3,790,896 2/1974 Shimizu et al. ........................ 330/29
4,115,741 9/1978 Skutta .................................. 330/284
4,771,472 9/1988 Williams, III et al. ................ 381/94

FOREIGN PATENT DOCUMENTS 57-079722 of 0000 Japan .

OTHER PUBLICATIONS

*Patent Abstracts Of Japan, vol. 006, No. 160, Aug. 21, 1992 & Japanese 57–079722, Matsushita Electric Ind. Co. Ltd. May 1982.

Primary Examiner—Vivian Chang
Attorney, Agent, or Firm—Joseph S. Tripoli; Frederick A. Wein

[57] ABSTRACT

A circuit presented automatically controls sound level. Sudden peak signal levels are controlled with a fast time constant of response and the overall sound level is controlled with a slower time constant of response. The feature can be enabled or disabled by the user via a microprocessor responsive to a remote control.

8 Claims, 1 Drawing Sheet

DUAL ACTION AUTOMATIC SOUND LEVEL CONTROL

FIELD OF THE INVENTION

The present invention concerns electronic devices which have an audio output, and more particularly, television receivers.

BACKGROUND

The sound output level from a television receiver can vary with changes of channel and/or program. Such a situation is considered by many users to be disturbing, and sometimes readjustment of the volume control is desired. For such situations, an automatic sound level control can enhance user comfort.

Accordingly, it is desirable to provide apparatus for the automatic control of sound level when there is a variation in the sound output level between channels and/or programs.

SUMMARY OF THE INVENTION

The present invention provides a dual action ability for automatically controlling sound level. Sudden peak signal levels are controlled with a fast time constant of response, and changes in the overall sound level are controlled with a slower time constant of response. A further feature of the invention allows that the automatic control of sound level can be enabled or disabled via a microprocessor, for example, responsive to a remote control.

BRIEF DESCRIPTION OF THE DRAWING

The sole FIGURE shows a schematic diagram of an automatic sound level controller according to aspects of the present invention.

DETAILED DESCRIPTION OF THE PREFERRED EMBODIMENT

Figure 1:
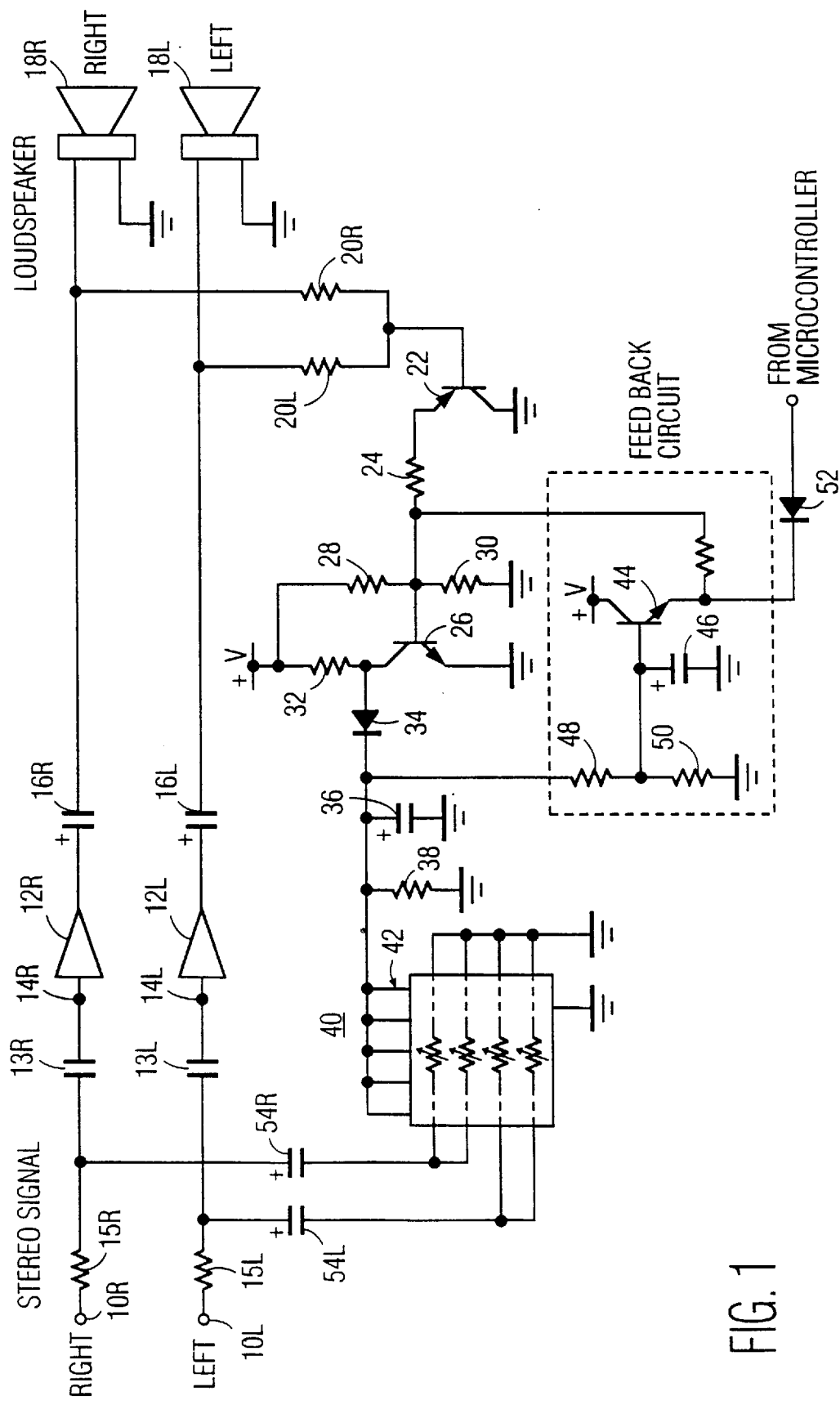

Referring to the FIGURE, there is shown an exemplary stereophonic audio output stage for a television receiver or the like. Since the "right" and "left" channels are identical, only the "right" channel will be described in detail. A right stereo signal 10R is coupled to stereo audio amplifier 12R at input terminal 14R through capacitor 13R and resistance 15R. Resistance 15R can be a physical resistor or equivalent circuit impedance. Stereo signal 10R has been previously processed by operational controls, e.g., volume, bass and treble. The amplified stereo signal at output 16R is coupled to stereo loudspeaker 18R.

The stereo output signals provided to loudspeakers 18R and 18L are coupled via summing resistors 20R and 20L to the base electrode of transistor 22, which is an emitter follower amplifier and serves as a buffer. The signal at the emitter electrode of transistor 22, is coupled through resistor 24 to the base electrode of transistor 26, with the amplified summed signals being provided at the collector electrode.

Transistor 26 is normally conducting due to the bias voltage applied to the base electrode by voltage divider 28, 30 connected between the supply voltage +V and a reference potential, e.g., ground. The collector of transistor 26 is also coupled to supply voltage +V via a load resistor 32. When transistor 26 is "on" (conducting), the collector electrode voltage is about 100 mV and diode 34 is not conducting, so that any charge on capacitor 36 discharges via resistor 38.

The audio signals provided to loudspeakers 18R and 18L are AC signals with positive and negative amplitudes. The positive part of the summed signal has no effect on transistor 26, because it would act to make transistor 26 conductive and it is already conducting. However, negative peaks of sufficient amplitude drive transistor 26 "off" and cause capacitor 36 to charge with a fast charging time constant via resistor 32 and diode 34 from the supply voltage +V. The charge on capacitor 36 is a control signal for controlling the resistance value of an attenuator portion 40, which is the lower portion of an AC voltage divider including resistors 15R and 15L, and coupling capacitors 54R and 54L.

In the exemplary embodiment, attenuator portion 40 is a CD4016 made by Harris Semiconductor Corporation of the United States, which are identified as integrated circuit quad bilateral "switches", each switch comprising a complementary pair of FET transistors. As the control voltage varies from 2 to 18 volts, the "on" resistance of each "switch" is continuously variable between the values of 3k ohms to 140 ohms. In the exemplary embodiment, two "switches" are connected in parallel for each channel, and all control gates 42 are connected in parallel. The amount of attenuation is determined by the resistance values of the "switches" of attenuator portion 40 in response to the value of the control signal and the values of resistors 15. For minimum attenuation, the control voltage should be below two volts, e.g., when the attenuator is inactive.

Transistor 26 is enclosed in a feedback loop which includes a transistor 44. The voltage on capacitor 36 is coupled to a capacitor 46 and a base electrode of transistor 44 through a voltage divider comprising a large resistor 48 and a resistor 50. At the Vbe conduction level of transistor 44, transistor 44 starts to conduct thus increasing the voltage at the base electrode of transistor 26. As the voltage at the base of transistor 26 rises, the period of conduction of transistor 26 gets longer and the charging of capacitor 36 decreases. The decrease of the charging on capacitor 36 reduces the conduction of transistor 44 due to the resulting reduction of the charge on capacitor 46.

The operation of the device according to aspects of the present invention is as follows:

The conduction of transistor 44 effects the circuit response time, the circuit release time, and the sensitivity of attenuator circuit 40. When the input signal to the base of transistor 26 is small, capacitors 36 and 46 are discharged, transistor 44 supplies no current to the base of transistor 26, and the attenuator circuit is inactive. When the input signal has a first characteristic of suddenly increasing in a negative direction, transistor 26 "turns off" at the beginning of the rising edge of the input signal, causing capacitor 36 to charge with a fast attack time. When the input signal decreases in a negative direction, transistor 26 "turns on" at the beginning of the falling edge of the input signal and stops the charging of capacitor 36. The charging of capacitor 36 causes the various "switches" of attenuator portion 40 to change resistance to a lower resistance value, thus causing an attenuation of the signal at terminals 14 and a reduction of the peak signal values of output signal 16. During this operation, there may be no conductivity in transistor 44 because the charging of capacitor 46 is much slower due to the long time constant of resistance divider 48, 50 and capacitor 46.

However, if there is a second characteristic of the output signal of a longer term overall increase in amplitude, then capacitor 46 has time to charge and transistor 44 will conduct. This conduction of transistor 44 will act upon transistor 26 to change the charging of capacitor 36 and change the amount of attenuation provided by attenuation portion 40 to correspond to the longer term overall sound level. In such a situation, if the overall sound level is loud enough, the attenuator will attenuate on a steady state basis and the total amount of additional attenuation available for reducing peak signals will be reduced by the amount of this longer term steady state attenuation. However, the ability of the circuit to suppress a sudden increase of input signal level is maintained since attenuation of sudden peaks depends upon the fast charging of capacitor 36 and is independent of the voltage on capacitor 46, which can only change slowly, i.e., in response to the average of the negative signal peaks.

It should be noted that the overall sound level of the output signal can still be varied by the user by changing the setting of the volume control (not shown), just as long as the volume control setting is less than the overall volume which initiates automatic volume level control.

In the exemplary embodiment, the user can enable or disable the automatic sound level control, for example, by remote control. A microprocessor (not shown) can be coupled via a diode 52 to the emitter electrode of transistor 44. If the signal from the microprocessor is HIGH, transistor 26 turns "on" and capacitor 36 discharges inactivating attenuator 40. A LOW signal from the microprocessor causes diode 52 to switch to an open circuit and the automatic sound level controller circuit becomes operational as discussed above.

I claim:

1. An arrangement for the automatic control of signal level comprising:

amplifier means having gain and having means for receiving a source signal, and a signal output for providing an output signal;

means for providing a control signal having an amplitude responsive to a first characteristic of the output signal with a first time constant of response;

means for changing the gain of the amplifier means in response to the amplitude of the control signal, and means for changing the amplitude of the control signal in response to a second characteristic of the output signal, for changing the gain of the amplifier means with a second time constant of response which is longer than the first time constant of response, the changing of the gain of the amplifier means in response to the control signal at the first time constant of response corresponding to peak levels of the output signal, and the changing of the gain of the amplifier means by the control signal at the second time constant for response corresponds to an average of the peak levels of the output signal.

2. The arrangement of claim 1 wherein the means for changing the gain of the amplifier means in response to the control signal at the first and second time constants of response comprises an attenuating means having a controllable voltage divider responsive to said control signal.

3. The arrangement of claim 2 wherein the means for attenuating comprises a resistance in a path of the source signal and a means responsive to the control signal coupled between resistance in the path of the source signal and a reference potential, and having a first impedance, the attenuation of the source signal being determined by the ratio of the resistance in the source signal path and the first impedance.

4. An arrangement for the automatic control of signal level comprising:

amplifier means having gain and having means for receiving a source signal, and a signal output for providing an output signal;

means for providing a control signal having an amplitude responsive to a first characteristic of the output signal with a first time constant of response;

means for changing the gain of the amplifier means in response to the amplitude of the control signal, and means for changing the amplitude of the control signal in response to a second characteristic of the output signal, for changing the gain of the amplifier means with a second time constant of response which is longer than the first time constant of response, the means for changing the amplitude of the control signal with a second time constant of response includes negative feedback which operates to effect the control signal in a direction opposite to the response of the means for providing a control signal.

5. An arrangement for the automatic control of sound level comprising:

amplifier means having gain and having means for receiving a source signal, and a signal output for providing an output signal, the output signal being coupled to a loudspeaker means for providing an audible output corresponding to the output signal;

means for detecting a first characteristic of the output signal and for providing a detected signal;

means for providing a control signal having an amplitude responsive to the detected signal with a first time constant of response;

means for changing the gain of the amplifier means in response to the amplitude of the control signal, and means for changing the amplitude of the control signal in response to a second characteristic of the output signal, for changing the gain of the amplifier means with a second time constant of response which is longer than the first time constant of response, the changing of the gain of the amplifier means in response to the control signal at the first time constant of response corresponds to peak levels of the output signal, and the changing of the gain of the amplifier means by the control signal at the second time constant for response corresponds to an average of the peak levels of the output signal.

6. The arrangement of claim 5 wherein the means for changing the gain of the amplifier means in response to the control signal at the first and second time constants of response comprises an attenuating means having a controllable voltage divider responsive to said control signal.

7. The arrangement of claim 6 wherein the means for attenuating comprises a resistance in a path of the source signal and a means responsive to the control signal coupled between resistance in the path of the source signal and a reference potential, and having a first impedance, the attenuation of the source signal being determined by the ratio of the resistance in the source signal path and the first impedance.

8. An arrangement for the automatic control of sound level comprising:

amplifier means having gain and having means for receiving a source signal, and a signal output for providing an output signal, the output signal being coupled to a loudspeaker means for providing an audible output corresponding to the output signal;

means for detecting a first characteristic of the output signal and for providing a detected signal;

means for providing a control signal having an amplitude responsive to the detected signal with a first time constant of response;

means for changing the gain of the amplifier means in response to the amplitude of the control signal, and means for changing the amplitude of the control signal in response to a second characteristic of the output signal, for changing the gain of the amplifier means with a second time constant of response which is longer than the first time constant of response, the means for changing the amplitude of the control signal with a second time constant of response includes negative feedback which operates to effect the control signal in a direction opposite to the response of the means for providing a control signal.

* * * * *